US006834364B2

(12) United States Patent
Krech, Jr. et al.

(10) Patent No.: US 6,834,364 B2
(45) Date of Patent: Dec. 21, 2004

(54) ALGORITHMICALLY PROGRAMMABLE MEMORY TESTER WITH BREAKPOINT TRIGGER, ERROR JAMMING AND 'SCOPE MODE THAT MEMORIZES TARGET SEQUENCES

(75) Inventors: Alan S Krech, Jr., Fort Collins, CO (US); Brad D Reak, Loveland, CO (US); Randy L Bailey, Ft Collins, CO (US); John M Freeseman, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 553 days.

(21) Appl. No.: 09/838,766

(22) Filed: Apr. 19, 2001

(65) Prior Publication Data

US 2002/0157042 A1 Oct. 24, 2002

(51) Int. Cl.[7] .............................................. G06F 11/273
(52) U.S. Cl. ........................ 714/45; 714/718; 714/732
(58) Field of Search ............................ 714/45, 31, 718, 714/732, 819, 736, 737

(56) References Cited

U.S. PATENT DOCUMENTS

| | | | | | |
|---|---|---|---|---|---|
| 5,604,756 | A | * | 2/1997 | Kawata ...................... | 714/773 |
| 5,668,819 | A | * | 9/1997 | Fukushima ................. | 714/736 |
| 5,771,240 | A | * | 6/1998 | Tobin et al. ................ | 714/724 |
| 6,253,338 | B1 | * | 6/2001 | Smolders .................... | 714/45 |
| 6,282,134 | B1 | * | 8/2001 | Kumar ........................ | 714/45 |
| 6,327,544 | B1 | * | 12/2001 | Samuels ..................... | 714/724 |
| 6,360,340 | B1 | * | 3/2002 | Brown et al. ............... | 714/718 |
| 6,615,369 | B1 | * | 9/2003 | Beck et al. .................. | 714/39 |

* cited by examiner

Primary Examiner—Robert Beausoliel
Assistant Examiner—Joseph D. Manoskey
(74) Attorney, Agent, or Firm—Edward L. Miller

(57) ABSTRACT

A trigger signal for a memory tester uses a (breakpoint) trigger qualified according to what part of the test program is being executed. The qualified breakpoint trigger can be delayed before becoming a system trigger signal that can be used to trigger a 'scope mode and to force an error flag to a selected value so as to compel a particular path with the test program. To provide stable waveforms for the sweeping of the voltage thresholds and sample timing offset the memory tester records the addresses for a target sequence of transmit vectors issued during an initial pass through the test program subsequent to the occurrence of the trigger. These addresses are exchanged for the instructions themselves, which are then altered to remove branching, and stored in a reserved portion of the memory they came from. Once the altered target sequence is stored the desired information is produced by restarting the entire test program and letting it run exactly as before down to the trigger. Now when the trigger occurs further transmit vectors are issued from the memorized target sequence, rather than from the live algorithm, and a combination of voltage thresholds and the sample timing offset are switched into place. After the target sequence the test program is re-started with normal thresholds and sample timing offsets. There is eventually another trigger, whereupon the memorized target sequence is again substituted while the next combination in the step along the acquisition sweep is instituted. This process is continued until the entire acquisition sweep has been performed. An inspection of the stored data allows creation of the waveforms.

10 Claims, 5 Drawing Sheets

ALGORITHMICALLY PROGRAMMABLE MEMORY TESTER WITH BREAKPOINT TRIGGER, ERROR JAMMING AND 'SCOPE MODE THAT MEMORIZES TARGET SEQUENCES

REFERENCE TO RELATED APPLICATION

This disclosure is related to information appearing in U.S. patent application Ser. No. 09/665,892 entitled ERROR CATCH RAM FOR MEMORY TESTER HAS SDRAM MEMORY SETS CONFIGURABLE FOR SIZE AND SPEED, filed 20 Sep. 2000, which issued on 20 Nov. 2001 as U.S. Pat. No. 6,320,812, and for the reasons given below is hereby expressly incorporated herein by reference. The subject matter of the instant disclosure concerns a portion of the operation of a rather large and complex system for testing semiconductor memories. The memory tester described contains within itself an extensive memory subsystem as a component in the overall paradigm for performing tests. Certain capabilities of that memory subsystem are of interest here, in that they serve as the preferred basis for some of the novel subject matter to be disclosed. For reasons of economy in the product, and abetted by the desire to have large amounts of memory available within the tester, a way was developed to use inexpensive memory (DRAM that is slow when randomly accessed) as a substitute for expensive SRAM that is fast even when randomly addressed. The result, when combined with various other memory subsystem features, is a very complex affair involving multiplexing among Groups and interleaving among Banks, as well as implementing such things as variable word width. On the one hand, the particular features we seek to disclose here could be implemented in a system using only SRAM, with a considerable reduction in complexity. There would be a considerable economic penalty, however, which would likely cause the finished product to be an engineering curiosity instead of a viable commercial technique. We have taken a middle ground in this disclosure, where we do not pretend to make the system entirely out of SRAM, although that would certainly be operable. We include the DRAM technique as a matter of course, but we have suppressed much of the messy detail about the internal operation of that DRAM technique, in favor of a modest description of its basic principles. Even a casual reader will conclude that much interesting material (e.g., the different interleaving and addressing schemes and their connection to the different modes of operation) has been omitted. However, every reader will, upon reflection, appreciate that the techniques and features that we seek to disclose do not fundamentally depend on that omitted material, even though they may, in some cases, be slightly influenced by it. So we have a case of ragged edges that are peripheral to the main issues of interest. The disclosure incorporated above supplies an abundance of detail concerning the DRAM technique. Those that feel that the instant disclosure raises more issues about the memory subsystem than it answers can go to the incorporated disclosure for those answers. It is for that reason that its existence has been made known by being incorporated herein by reference.

That said, there is a caveat for those who wish to combine the teachings of the two disclosures. The incorporated disclosure takes the view that the totality of the memory of interest is called an Error Catch RAM (ECR) and that it is divided into Memory Sets. This point of view works without difficulty in the incorporated disclosure, since in that disclosure an ECR is nearly the sole memory function of interest, even though the existence of other such functions is alluded to. However, upon reflection during the preparation of the instant application it was found to be more convenient to describe the totality of memory of interest using the term "Interior Test Memory," which is in turn composed of four separate and independent Memory Sets, within which the various functional memory mechanisms (including an ECR) could be defined by suitable configuration. So it would appear that in the incorporated disclosure Memory Sets are contained in an ECR, while herein it is the other way around. Nevertheless, both disclosures are directed to subject matters found in the same overall system. The difference is largely a matter of terminology, and any seeming inconsistency between the two disclosures vanishes when it is the lower level details of memory subsystem operation that are being considered. And it is to make those details available to the interested reader that we have pointed to that incorporated disclosure.

The subject matter of this disclosure is also related to that in U.S. patent application Ser. No. 09/702,631 filed 31 Sep. 2000 and entitled MEMORY TESTER WITH ENHANCED POST DECODE, which issued 3 Feb. 2004 as U.S. Pat. No. 6,687,861. In this Disclosure we have borrowed a significant portion of their FIG. 5, modified part of that, added on to it and then used that as our FIG. 5. As a hedge against the possibility that the common portion may appear out of context herein, and for brevity, we have accordingly chosen to incorporate MEMORY TESTER WITH ENHANCED POST DECODE herein by reference.

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory testers frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and facilitates the use of logical methods to isolate portions of the pattern that do not perform as expected. A test pattern that is generated algorithmically using instructions and commands that are repeated in programming loops consumes less space in tester memory. Accordingly, it is desirable to have algorithmic test pattern generation capability in a memory tester.

Precise signal edge placement and detection is also a consideration in the effectiveness of a non-volatile memory tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate "transmit" vectors that are applied (stimulus) to the DUT (Device Under Test), and "receive" vectors that are expected in return (response). The algorithmic logic that generates these vectors can generally do so without troubling itself about how a particular bit in a vector is to get to or from a particular signal pad in the DUT, as the memory tester contains mapping arrangements to route signals to and from pins.

Memory testers have interior test memory that is used to facilitate the test process. This interior test memory may be used for several purposes, among which are storing transmit vectors ahead of time, as opposed to generating them in real time, storing receive vectors, and storing a variety of error indications and other information concerning DUT behavior obtained during testing. (There are also housekeeping purposes internal to the operation of the memory tester that use SRAM and that may appear to fall within the purview of the phrase "interior memory." These are private to the internal operation of the tester, tend to not be visible at the algorithmic level, and are comparable to internal control registers. That memory is described as "interior control memory," and is excluded from what is meant herein by the term "interior test memory," which we use to describe memory used to store bit patterns directly related to the stimulus of, and response from, the DUT.) It is easy to appreciate that this interior test memory needs to operate at least as fast as the tests being performed; a very common paradigm is for the interior test memory (or some portion thereof) to be addressed by the same address (or some derivative thereof) as is applied to the DUT. What is then stored at that addressed location in interior test memory is something indicative of DUT behavior during a test operation performed on the DUT at that address. Algorithmic considerations within the test program may mean that the sequence of addresses associated with consecutive transmit vectors can be arbitrary. Thus, the interior memory needs to have the dual attributes of high speed and random addressability. SRAM comes to mind immediately as being fast, easy to control and tolerant of totally random addressing. Indeed, conventional memory testers have used SRAM as their interior test memory.

Unfortunately, SRAM is quite expensive, and this has limited the amount of interior test memory with which memory testers have had to work. The result is limits on memory tester functionality that are imposed by a shortage of memory. DRAM is significantly less expensive, but cannot tolerate random addressing and still perform at high speed.

DRAM can replace SRAM as the interior test memory in a memory tester. As briefly described in a simplified overview below, the problem of increasing the speed of DRAM operation for use as interior test memory can be solved by increasing the amount of DRAM used, in place of increasing its speed. Numbers of identical Banks of DRAM are treated as Groups. A combination of interleaving signals for different Banks of memory in a Group thereof and multiplexing between those Groups of Banks slows the memory traffic for any one Bank down to a rate that can be handled by the Bank. (For the reader's convenience, we include a very abbreviated summary of this technique here, since much of its architectural aspects and associated terminology are useful in the explanation of the inventive subject matter that follows.)

A three-way multiplexing between three Groups of four Banks each, combined with a flexible four-fold interleaving scheme for signal traffic to a Group produces an increase in operating speed approaching a factor of twelve, while requiring only three memory busses. A round robin strategy for choosing the next Group for the multiplexer is simple and assures that the interleaving mechanism for each Group has the time it needs to complete its most recently assigned task. All interleaved accesses within a Group are performed upon a next Bank (within that Group), also selected by a simple round robin selection. In this configuration, each of the twelve Banks represents a duplicate instance of the entire available address space, and any individual write cycle might end up accessing any one of the twelve Banks. An implication is that, at the conclusion of testing, all twelve Banks must be investigated to learn what failures happened during testing of the DUT, since the history of any address or collection of addresses of interest will be spread out across all twelve Banks. A particular channel is thus represented by twelve bits (one bit from each Bank and whose bit position within the word for that Bank is determined by the channel).

It would be, however, awkward to have to (manually, as it were) individually consult all twelve Banks to discover failure information, so a utility mechanism has been provided to automatically "compose" (merge) results of all twelve Banks during a read cycle at an address into a unified result that can be stored in one or all twelve Banks. This allows composed data to later be read at full speed. Full speed in one embodiment is a 100 MHZ rate for randomly addressed memory transactions.

If 33 MHZ is fast enough, then random access can be supported with just the interleaving and no multiplexing, in which case the composition mechanism and the memory addressing scheme are suitably adjusted. The addressing scheme changes to include extra Group selection bits that allow the depth of the memory to be three times deeper than for random 100 MHZ operation. These two modes of operation are called R100 and R33, respectively. There is also an L100 mode of 100 MHZ operation to single Banks that relies on well behaved addresses being sent to the DRAM (an absolute minimum of row address changes).

At the top level of interior test memory organization there are four Memory Sets, each having its own separate and independent address space and performing requested memory transactions. Two are of DRAM as described above, and two are of SRAM. Each Memory Set has its own controller to which memory transactions are directed. As to externally visible operational capabilities, all four Memory Sets are essentially identical. They differ only in their size of memory space and how they are internally implemented: The SRAM Memory Sets do not employ multiplexing and interleaving, since they are fast enough to begin with. Despite their independence, Memory Sets of the same type (of SRAM or of DRAM) may be "stacked," which is to say treated a one larger address space. This is done at the level of control above the Memory Sets themselves, in the algorithmic generation of the addresses and the decision as to which Memory Set to actually send a memory transaction. It is not as automatic as the way in which the Memory Sets and their controllers can stack groups to triple the address space as between the R100 and R33 modes of operation. For each of the Memory Set controllers, it has no clue that there even is such a thing as another Memory Set with another controller.

Thus it is that the interior test memory of the tester is divided into four Memory Sets, two of which are "internal" SRAM's and two of which are "external" DRAM's. To be sure, all this memory is physically inside the memory tester; the terms "internal" and "external" have more to do with a level of integration. The SRAM's are integral parts of a VLSI (Very Large Scale Integration) circuit associated with the tester's central functional circuitry, while the DRAM's are individual packaged parts mounted adjacent the VLSI stuff. The amount of SRAM is fairly small, (say, around a megabit per Memory Set) while the amount of DRAM is substantial and selectable (say, in the range of 128 to 1024 megabits per Memory Set). The SRAM Memory Sets are always present, and may be used for any suitable purpose, such as storing the expected content of a DUT that is a ROM (Read Only Memory). The DRAM Memory Sets are actually optional, and are typically used for creating a trace for subsequent analysis leading to repair, although there are also other uses. The tester does not enforce a distinction between the SRAM and DRAM Memory Sets, as to different purposes for which they may be used. Those distinctions arise mostly as a matter of size. The SRAM Memory Sets are small, while the DRAM Memory Sets are potentially huge. The person or persons creating the test programming make the decisions concerning how the various Memory Sets are to be used.

We mentioned earlier that an algorithmic capability was desirable in developing and maintaining the test programs that are to be executed with the memory tester. In addition to the complexity that programmability allows (loops nested within loops, branching on test results), there are various special operational capabilities designed into it to facilitate both the automated testing of non-volatile memories in general, as well as of non-volatile memories that have certain peculiar properties. The import of all this is that there can be a corresponding complexity imparted to the development and maintenance activities for the test programs. In short, it is common for a test program to be a complicated mechanism unto itself.

Consider, then, the situation of a person developing a test program. It will not be uncommon for initial versions to fail to perform as expected; they do things they are not supposed to do and they don't do things that they are supposed to. There are times when studying the code does not help (suppose that it is as correct as current understanding permits), and the most appropriate tool for finding out what is going on is an oscillographic trace of voltage waveforms: a source of additional data is needed to advance the process of understanding what is happening, or to verify a theory, etc. Unfortunately, it is not a practical matter to simply approach the test head and attach a probe or two for your favorite oscilloscope. Even if one could identify the actual physical locations where they would be attached (possible in principle, but often very difficult in practice), there is usually not enough room to do it, nor is that physical structure strong enough to support a probe and its cable. There is also the question of electrical loading or other disturbances to the desired measurements. And even if all those issues were overcome, there is still the problem of how to trigger the 'scope so that the data captured pertains to the problem of interest.

As for the difficulty of connecting 'scope probes, we will stand on what we have just said. As for the issue of the data the 'scope is exposed to and what is captures, there is yet more background to appreciate before that issue can be properly understood. A useful point of departure here is a type of memory tester termed a "vector" machine, such as may be found in the 83000 VLSI Test Series from Agilent Technologies.

A vector driven tester has an explicit list of stimulus vectors that it will apply, in order, to the DUT. It simply applies those and records what receive vectors occurred. It is very much an immediate-stimulus/immediate-response type of system: put this in, get that out. The nature of a vector machine and its DUT is such that the execution of the list can be interrupted at any time and execution re-started from some preselected convenient location in the list of transmit vectors. Similar to the algorithmically driven pattern oriented memory tester we will describe below, a vector tester has (for creation of receive vectors) variable sampling thresholds and variable sample timing offsets that are relative to some clock signal. A thing that is not present is an analog-to-digital converter that will digitize the analog voltage waveform of an associated channel. Nevertheless, the resources that are present can be used to reconstruct the voltage waveform on channels of interest during selected vectors. It is cumbersome, but it works (and there is no practical alternative). Here is how.

During ordinary (non-'scope mode) operation a particular pair of threshold values and a sample timing offset are selected, and data recorded for the sequence. The thresholds are VOH and VOL (Voltage Out High and Voltage Out Low), and are adjustable in steps of perhaps ten millivolts.

The VOH threshold is met if, at the time specified by that channel's sample timing offset, the channel voltage exceeds VOH, while the VOL threshold is met if the channel voltage is less than VOL. The names of the signals that represent these conditions are YVOH and YVOL, respectively. What is recorded for the associated channel in the receive vector is whether the channel voltage met each of the thresholds at the instant represented by the sample timing offset.

For the 'scope mode, the basic idea is to find, for suitably spaced points in time along the waveform, what threshold values are on either side of the waveform at those points. To do this, a sequence of vectors containing the events of interest must be executed repeatedly. During such repeated execution the VOH voltage threshold is changed slightly between instances of repetition, and as the sequence is continually repeated and more and more data is stored. This might be continued until both extremes for the VOH threshold value have been used. For each vector in the sequence, the recorded receive results can be interpreted to create a contribution to an oscillographic trace. (Suppose that consecutive instances of YVOH were the same in value [TRUE], then at a certain instance the new value of YVOH changed [FALSE], after which consecutive values again became the same [both FALSE], but with a value opposite what they had when they were earlier the same, and then remained oppositely switched. That would indicate a stable voltage value for the channel at that point in time when the value changed from TRUE to FALSE, which point in time is identified by the (unchanging) sample timing offset in use for that progression of VOH values. The stable voltage value is somewhere between those consecutive instances of VOH for which YVOH changed value. There are also other cases in this well understood prior art technique, which, for the sake of brevity, we shall not mention.) For each vector, the afore-mentioned contribution will be for that sample timing offset only.

It will be appreciated that simply incrementing VOH from one extreme to another is not the only possible manner of finding a pair of VOH values that are suitably close together and for which the associated YVOH's have opposite values. For example, there may be little point in sweeping over a five volt range for a three volt part. Next, given a starting point, it may be sufficient to cease incrementing once the transition has been found, or after a further few more increments confirm that the transition was indeed about there, even for a somewhat noisy signal. (A sampling that proceeds through a noisy transition can benefit from averaging.) Finally, one could even use a binary or other search strategy, including prediction, to try to minimize the number of repetitions needed to discover the relevant values of VOH that are associated with the desired transition in YVOH. This stuff is of interest to a user, because such strategies can significantly reduce the amount of time needed to produce the waveform(s) sought. Even so, it might still require minutes to complete the entire operation.

The next step is to repeat the entire operation with another sample timing offset. Eventually we will have created a complete description of the voltage behavior of the channel (s) during the vectors of interest, and can display it as a voltage waveform, just as in any digital oscilloscope. The vertical (voltage axis) resolution will be the step size for changing VOH, and the horizontal (time axis) resolution will be the step size for changing the sample timing offset (which can be as small as twenty picoseconds). This is a prior art technique that has been used in testers that are of the vector machine type. We'd like to use it in our algorithmically controlled pattern machine, but there are some serious difficulties.

Whereas a vector machine easily performs its trigger function by simply identifying one of the vectors in the explicit list thereof as when to trigger, it should be appreciated that in an algorithmically controlled machine "triggering the 'scope" (identifying the particular receive vectors to store data for) is non-trivial. As is usual in a digital environment, a simple analog trigger level with slope is almost certainly useless. Even detecting certain combinations of(simultaneous) signal values (a parallel word) is, by itself, often inadequate. Nor can one usually go to the code being executed to perform the test algorithm and say "Here. Trigger when we execute this instruction word." There can be times when that will work, but often it will not, because it requires that there be in the code an instruction whose execution is uniquely associated with the failure. The algorithmic possibilities are often far too complicated, and the instruction "at fault" may appear in a loop and works perfectly well thousands or millions of times prior to the occurrence of the error.

We must also remember that the exact same series of events must occur many times (perhaps as many as the product of the number of different values of VOH with the number of different values for the timing offset) before there is sufficient captured data to allow the waveform(s) to be reconstructed as an oscillographic trace. Now assume that the test program includes a branch on an error flag (an error flag means the DUT's response did not match some expectation). Error flags alter test program flow. But during repetitions for the 'scope mode error flags are going to occur more frequently than not, and in every vector that is to contribute to the trace. Why? Because of the sweeping of the threshold and the sample timing offset. That sweeping is bound to create "wrong answers" that set the error flag and alter program flow, even when the DUT is not malfunctioning. It is almost a certainty that altered program flow would alter the waveforms in some corresponding way. But if the activity that is needed to reconstruct a trace from repeated identical instances of waveform activity alters the waveforms (as a result of altering program flow), then there will not be a stable waveform and no intelligible trace can be reconstructed. But branching on error flags within a test program is a powerful device, and one which we are unwilling to give up. That is, it should not be necessary to require test programs to be written in some restricted fashion to be usable with the 'scope mode. Besides, we want a user of the memory tester to be able to apply the 'scope mode to any pre-existing test programs without having to modify them to produce stable repetitions. Nor do we wish to perform source code modifications of test programs to facilitate or include trigger instructions. Instead, we want the memory tester itself to take care of these awkward issues on our behalf, in addition to reconstructing the trace from captured data obtained while sweeping the thresholds and the sample timing offset.

In addition, once a trigger specification mechanism is provided, we should like to be able to use the resulting trigger to force internal test program branching based on error flags to follow a particular path, regardless of the actual values of the associated error flags. For example, a test program may contain many branches that correspond to particular types of failures in the DUT. The programmer would like to verify that these various branches are all accessible, and that they perform as intended. The problem is how to invoke the various branches without having to edit the code, and also without having a collection of special DUT's known to have exactly the right malfunctions to cause the desired exercising of the test program.

What to do?

SUMMARY OF THE INVENTION

A solution to the problem of providing a trigger signal to the 'scope mode of a memory tester having an algorithmic pattern generator used in the execution of test programs having a substantial algorithmic content is to equip the algorithmic pattern generator with hardware to detect the occurrence of a trigger specification expressed in terms of existing hardware quantities used to operate the DUT, such as address and data, as well as incorporating the content of certain existing auxiliary registers that are provided to facilitate algorithmic behavior. This forms a raw hardware (breakpoint) trigger that can be further qualified according to what part of the test program is being executed. (The language presently used to create test programs does not allow the creation of abstract variables that exist only as values in an arbitrary memory location that is not one of the registers mentioned above. Accordingly, hardware masking and AND'ing performed on particular hardware registers in the algorithmic pattern generator is an adequate starting point for trigger generation.) The qualified breakpoint trigger can be delayed by zero or more DUT cycles before becoming a system trigger signal that can be used to trigger the 'scope mode and to jam (force) an error flag to a selected value (so as to compel a particular path with the test program).

The test program itself is written in a language that resembles pseudo code, but with a constrained set of variables, as mentioned above. A compiler operates on this source code to produce executable instruction words that both control and respond to conditions in the rest of the hardware in the algorithmic pattern generator. A user interface aspect of the 'scope mode process preferably executes in a separate environment, and the user interacts with that process to define a trigger specification. The 'scope mode process sets up the masks and comparison mechanisms that recognize the raw trigger condition at the level of the hardware register values. It also informs the compiler as to which portions of the test program are to be considered as enabling the raw trigger specification. This is accomplished in the compiled code by providing in the executable instruction words for the algorithmic program generator a bit that means "the triggering function is presently enabled." The monitoring of values for abstract variables not closely tied to the test hardware and a genuine logic analyzer style sequential trigger might at some point be desirable, but are not necessary.

A solution to the problem of providing stable waveforms for the sweeping of the voltage thresholds and sample timing offset is for the memory tester to "memorize" (i.e., record) the sequence of transmit vectors that are issued during an initial pass through the test program subsequent to the occurrence of the trigger, up to some suitable number, say, one hundred and twenty-eight. Let us call that sequence the "target sequence." Once the target sequence is stored in memory ("memorized"), the 'scope mode can extract the desired information by restarting the entire test program (because some initial conditions may need to be established) and letting it run exactly as before down to the trigger. But now when the trigger occurs further transmit vectors are issued from the memorized target sequence, rather than from the live algorithm, as it were, and a combination of VOH and the sample timing offset are switched into place. That combination constitutes one step along the acquisition sweep of their values, and is retained until the end of the memorized target sequence is reached. (An "acquisition sweep" is not to be confused with the "horizontal sweep" of an oscillographic presentation.) The corresponding sequence of receive vectors is automatically stored as they arrive. At the end of the target sequence the test program is re-started again (but with normal thresholds and sample timing offsets). In due course there is eventually another trigger, whereupon the memorized target sequence is again substituted for the live algorithm while the next combination in the step along the acquisition sweep is instituted until the end of the target sequence is again reached. As before, the receive vectors associated with that step in the acquisition sweep are automatically stored. This process is continued until the entire acquisition sweep has been performed, at which time the waveforms for the signals of interest during the target sequence can be created by suitable inspection of the corresponding collection of automatically stored receive vectors.

The technique described above is facilitated by equipping the memory tester with a FIFO (or other memory structure) for memorizing the target sequence and also with a control mechanism to oversee the memorizing and the subsequent switch to executing the memorized target sequence upon the occurrence of the trigger. Since the executable program word is much wider (two hundred eight bits wide) than the address needed to index through the program, it is the sequence of addresses for the instruction words in the target sequence that gets stored in the FIFO, rather than the instruction words themselves. After the addresses for the target sequence are stored in the FIFO and before the acquisition sweep begins, those addresses are used to fetch and store the corresponding actual sequence of instruction words. Any branching constructs in the copied target sequence are altered to point to the next word in the sequence (which will be the word that happened, anyway, during the initial capture of the target sequence). This executable target sequence is stored in a reserved portion of a Program SRAM that contains the instruction words that are the compiled test program. When subsequent system triggers occur test program execution is temporarily halted to institute the VOH and sample timing offset values for the next step in the acquisition sweep, and the program counter addressing the Program SRAM is set to the start of the reserved portion. Thus, once the next step in the acquisition sweep is set up, test program execution will resume with a repeat of the initially captured target sequence. The results (receive vectors) of each step in the acquisition sweep are temporarily stored (cached, as it were) in an ECR (Error Catch RAM). Such storage of receive vectors in an ECR is a normal operation, but which is usually conditioned upon certain errors of interest. Here we want it stored regardless of errors, and a simple mechanism is provided to accomplish that.

In addition, special registers aid in the rapid change of thresholds and sample timing from "normal" to "swept" when the satisfied trigger condition is detected. The technique is further facilitated by arranging for the operating system that oversees the execution of the test program (and that administers the 'scope mode) to have a private stash of memory that is used to unload the cached receive vectors from the ECR that were automatically stored during each step of the acquisition sweep over the target sequence. It is that stash of memory that the 'scope mode then uses to accumulate and eventually create and display the waveforms for the signals of interest.

The problem of test program verification is assisted by using the trigger of the 'scope mode (but probably sans the 'scope mode of operation) to jam selected values for selected error flags into the environment of the executing test program. This forces the appearance of the associated type of error, even though it really didn't happen. To be sure, the same error flags are apt to mean different things at different locations within the test program. To delay the occurrence of the error flag until a particular part of the program is reached is how the trigger is used. Just which error flags the trigger "synthesizes" is configurable. In this way the various error related branches of a complicated program can be exercised by "walking" the trigger through the program, even though the DUT in use is perfectly good.

DESCRIPTION OF A PREFERRED EMBODIMENT

Figure 1:
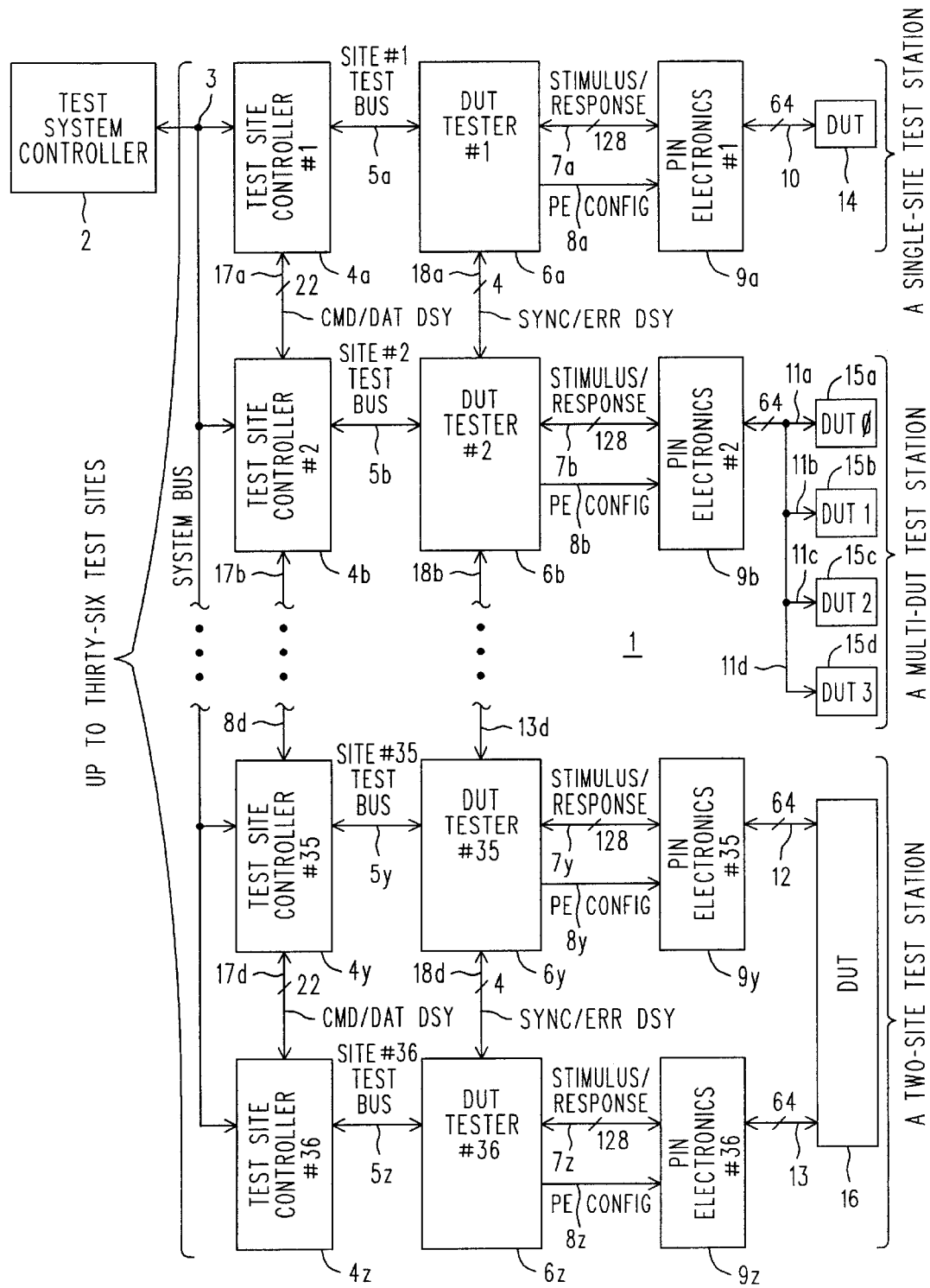
FIG. 1 is a simplified block diagram of an extensively reconfigurable and algorithmically driven non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

Figure 2:
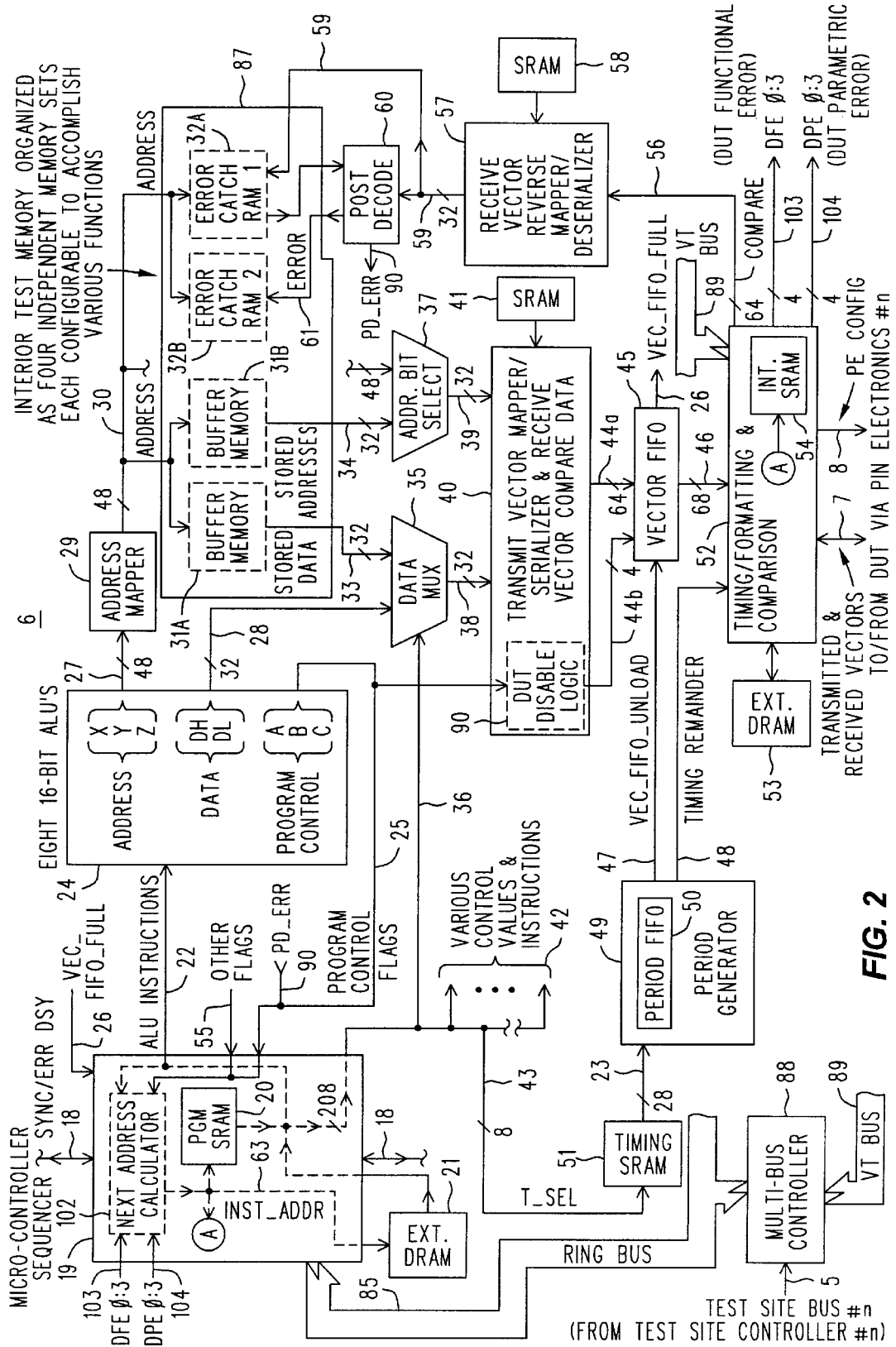
FIG. 2 is a simplified block diagram expansion of the DUT tester 6 of FIG. 1.

To briefly consider an opposing case, one should not assume that an entire Test Site is needed to test a single DUT, or that a single Test Site can test but a single DUT. Suppose that a wafer had two, three or four (probably, but not necessarily, adjacent) dies, the sum of whose test channel requirements were sixty-four channels or less. Such DUT's (15a–d) can be tested simultaneous by a single Test Site (e.g., Test Site #2 as shown in FIG. 2). What makes this possible is the general purpose programmability of each Test Site, as augmented by certain hardware features to be described in due course. In principle, a test program executed by the Test Site could be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. A major difference is, of course, individually keeping track of which of the two "component DUT's" pass or fail, as opposed to a simple unified answer for the "third" DUT. That is, there is an issue concerning what portion of the "third" DUT failed. There are other issues as well, including removing or limiting the drive signals to a bad DUT, branching within the test program based on which DUT indicates failure, while at the same time preventing the test program from becoming hopelessly multi-threaded. Certain simple aspects of this "Multi-DUT Test Station" capability at a single Test Site are fairly simple, while others are complex. Multi-DUT testing should not be confused with the notion of bonding two or more Test Sites together.

Were it not for this notion of Test Site reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were sometimes split to create more Test Stations for simple Multi-DUT testing (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, some as multi-DUT Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_ WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester 6 is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes going to the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment, and chilled water is cheaper than air conditioning to remove the several tens of KW of dissipated heat for a fully loaded system), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that the "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Multi-Bus Controller 88 that converts traffic on the Test Site Bus to traffic on a Ring Bus 85 or a VT Bus 89. Ring Bus traffic can also converted to VT Bus traffic, and vice versa. Almost everything in FIG. 2 is part of some large scale integrated circuit; the Timing/Formatting & Comparison circuit 52 (described below) is actually eight such IC's, although we show it as one entity for the sake of brevity. Save for the various Ext. DRAM's (some of which are also part of the Interior Test Memory 87—see FIG. 3), most of the rest of the stuff in FIG. 2 is part of another large IC called the APG (Automatic Pattern Generator). The Ring Bus 85 is a general purpose inter-mechanism communication path for configuring the major elements within the APG portion of the DUT Tester 6, and for setting modes of operation, etc. There also various dedicated very wide and high speed paths between various elements of the APG. The VT Bus 89 is an IC to IC bus for use within the DUT Tester itself.

The Ring Bus 85 is the mechanism by which the Test Site Controller communicates with the APG portion of the DUT tester 6. The Ring Bus 85 is coupled to a Micro-Controller Sequencer 19, which may be likened to a special purpose microprocessor. Using an address created by a Next Address Calculator 102, it fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is part of the large APG IC), so its size is limited. The external DRAM can be provided in adjustable amounts of considerable quantity, but is fast only when accessed in sequential chunks involving linear execution and no branching. Programming in the SRAM 20 is most often that which is intensely algorithmic, while the EXT. DRAM 21 is best suited for material not readily generated by algorithmic processes, such as initialization routines and random or irregular data.

The Next Address Calculator 102 can implement branching in the test program being executed, in response to unconditional jump either instructions or conditional jump or conditional subroutine instructions conditioned on various PROGRAM CONTROL FLAGS (25), OTHER FLAGS (55), and certain other signals that, for clarity are shown separately (DFE 0:3 103 and DPE 0:3 104) and which are provided for multi-DUT operation.

The instruction word fetched and executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address (created by Next Address Calculator 102) in ways familiar to those who understand about micro programmed execution mechanisms. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: PD_ERR 90. It is supplied to the PGM SRAM 20, originates with the Post Decode mechanism 60, and indicates that the Post Decode mechanism 60 has discovered an error. Another such additional flag is VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for-bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to various Buffer Memories and/or Tag RAM's 31A–B and to Error Catch RAM1/2 (32A/B), which, while having separate functions, may nevertheless be implemented as selectable partitions in the four Memory Sets that are collectively the Interior Test Memory 87. The mapped address output 30 is also applied as one input to an Addr. Bit Select circuit 37, whose multiplexing function is described in due course. The Interior Test Memory can be configured to contain many instances of various RAM-based memory structures used for different functions. This is accomplished by declaring that certain portions of the different Memory Sets are to be used for the associated purposes. What is shown in FIG. 2 is one such arrangement; arrangements can be changed as testing proceeds, and this whole business of Memory Set usage should be considered to be very dynamic. None of the inhabitants of the Interior Test Memory (e.g., the error Catch RAM's 32A–B) are permanent hardware fixtures. What is permanent are the four Memory Sets. But which part of which Memory Set is an Error Catch RAM at any given time (if indeed there is even one defined) is dependent on whatever configuration has been established.

Consider the Buffer Memories 31A and 31B. Their functions are to retain data patterns 33 and addresses 34 that can be applied to the DUT. These are actual separate outputs from their associated Buffer Memories, although these Buffer Memories are not "dual port" memories, but are preferably composed of portions of two different Memory Sets. In keeping with this, it is preferred that Stored Data 33 is kept in one Memory Set, while Stored Addresses 34 are kept in another. Also, we have not shown an explicit mechanism for writing to a Buffer Memory. One way that may be accomplished is by an addressed bus operation initiated by a Test Site Controller 4 at the behest of the program it is executing. There is an "under the floorboards," as it were, "utility services" bus called the Ring Bus 85 that goes to just about everything in FIG. 2 (most of the visitations of which are not shown—as that would clutter the drawing immensely). Another and faster way of writing information to the Memory Sets is described in connection with FIG. 3.

The Error Catch RAM's 32A–B are addressed by the same address that is applied to the Buffer Memories, and they either store or retrieve information about errors, which operations are performed in conjunction with a Post Decode Circuit, to be discussed later. As with the paths 33 and 34 from the Buffer Memories 31A–B, paths 62A–D (from the Error Catch RAM1 32A) are preferably MUX'ed outputs from a portion of a Memory Set (configured to operate as an Error Catch RAM), in accordance with configuration information distributed by the Ring Bus (not shown).

Note that the Data MUX 35 has as inputs the STORED DATA output 33 from the Buffer Memory 31 A as well as data 28 from the registers DH and DL in the collection 24 of ALU's. The Data MUX 35 performs an initial selection, in accordance with values 36 stored in PGM SRAM 20, of which of these inputs (28, 32) to present as its output 38, which, unless modified as described next, is then applied as one of two vector components to a Transmit Vector Mapper/Serializer/Receive Vector Compare Data Circuit 40 (the other component is the output 39 of the Addr. Bit Select circuit 37).

Circuit 40 can perform three vector related functions: assemble vector components (38, 39) into an ordered logical representation of an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19.

Also contained within circuit 40 is a section of DUT Disable Logic 90. Its purpose is to respond to various conditions, some static, some contingent on test outcomes, but all defined programmatically, that indicate which one or more DUT's, among as many as four thereof, are to be disabled. These indications are carried by four signals DD 0:3 44b (DUT Disable for DUT Zero, for DUT One, etc.) This is in support of multi-DUT testing on a Test Site. The output of Circuit 40 is an up to sixty-four bit vector 44a that, along with the DUT Disable signals 44b, is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance (among the various Test Sites) of Pin Electronics 9 receives Transmitted & Received Vectors 7 and Pin Electronics configuration information 8 from its associated Timing/Formatting & Comparison circuit 52.

The Timing/Formatting & Comparison circuit 52 is coupled to the VT Bus 89 to receive configuration and control information. It will be recalled that the Timing/Formatting & Comparison circuit 52 is actually eight IC's, which for our purposes we are treating as a single entity.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54, but is locally addressed by an incremented counter that is not shown.) The Internal SRAM 54 (or external DRAM 53) assists in the production of Drive and Comparison cycles, which have associated formats. Drive cycles apply a transmit vector to the DUT using a pre-selected format supplied by one of RAM's 54 or 53. Comparison cycles receive a vector presented by the DUT and examine it, also according to a pre-selected RAM-supplied format, to determine if it matches previously supplied comparison data. Both Drive and Comparison cycles are adjustable as to their duration, and appropriately adjustable as to whether and when a load is applied, when data is latched or strobed, if a signal is Return-To-Zero or not, whether to surround a driven signal with its complement, etc. (These options are the various formats mentioned above.)

The comparison produced by the Timing/Formatting & Comparison circuit 52 includes information, on a per channel basis, about whether a channel failed because a logical value was wrong (a functional error) and/or because its electrical properties are outside acceptable limits (a parametric error). Furthermore, when multiple DUT testing is performed it is known which channels are associated with which DUT's. This allows the production of the four signals DFE 0:3 (DUT # Functional Error) 103 and the four signals DPE 0:3 (DUT # Parametric Error) 104.

The comparison performed by the Timing/Formatting & Comparison circuit 52 also produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60, and also to Error Catch RAM1 32A. At present, it is sufficient to say that the Post Decode circuit 60 can inspect via programmatic criteria both incoming error information 59 and error information previously stored in the Error Catch RAM1 32A to produce condensed and more readily interpretable error information which may then by stored back into the other Error Catch RAM2 32B via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

The above concludes an introductory discussion of the overall nature of the memory tester. With that as a point of departure, we now turn our attention to the 'scope mode and its related topics.

Figure 3:
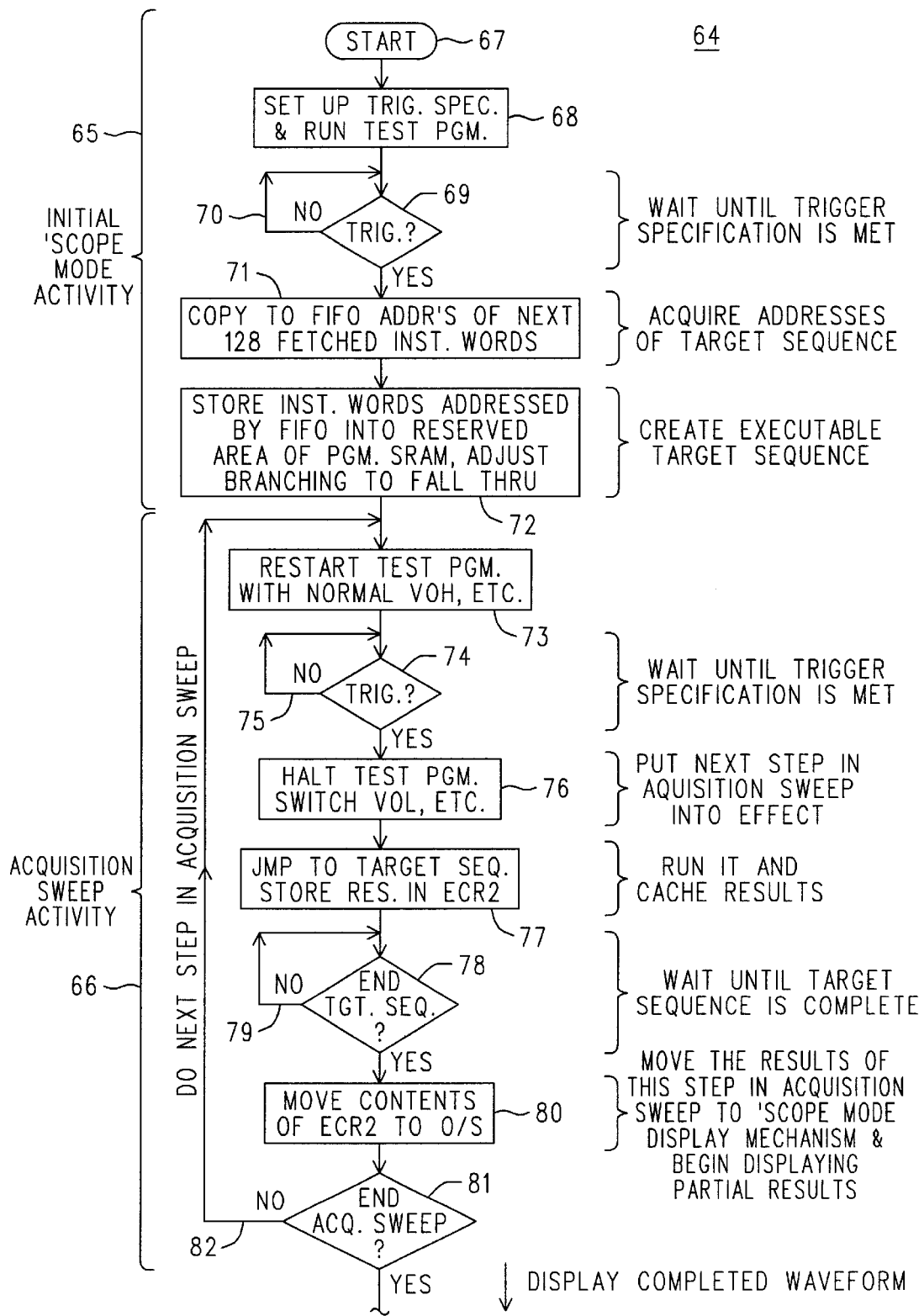
FIG. 3 is a flowchart overview of 'scope mode activity.

Refer now to FIG. 3, which is an overview, in flowchart form, of the principal actions undertaken during operation in the 'scope mode. Flowchart 64 of FIG. 3 has two major sections: 65 and 66. The first section 65 performs initial 'scope mode activity, while the second section 66 performs acquisition sweep activity. We begin with the initial activity performed by section 65. It's purpose is to set a trigger specification, acquire a target sequence and create a repeatedly executable version thereof.

Location 67 represents the entry into the balance of the flowchart 64 from some other activity, whereupon step 68 is the setting up of a trigger specification, followed by the running of the test program. In the present preferred embodiment the trigger specification includes an ALU component that is an "AND" condition upon the contents of the registers X, Y, Z, DH, DL, A, B, and C. Any subset of these registers, including all or none thereof, may be involved in the ALU component of the trigger specification. For each register, any subset of its bits, including all or none thereof, may be designated. The ALU component of the trigger specification is met whenever all the designated bits of all the selected registers are as specified. The trigger specification may also have a program component, in that it is possible to designated that only certain parts (or all of) the program enable the trigger to be satisfied. The trigger specification may also include a delay, (preferably expressed in DUT cycles, but possibly also as an absolute time interval) that is to separate the satisfaction of the trigger specification proper and the issuance of a trigger signal to commence triggered activity.

There are a variety of ways that the trigger specification activity can manifest itself at the user interface level. The preferred way is for the operating system (running on the Test System Controller 2) to provide a window within which to run a 'scope mode control process, wherein the user would specify which Test Site Controller, which DUT, and the program and ALU components of the trigger specification, as well as the channels for which waveform displays are to be created. Once all that is done the test program is started.

At step 69 there is a wait path 70 that occurs until test program activity causes the trigger specification is to be met (and until any specified delay has also been met), whereupon step 69 transitions to step 71. At this point the threshold VOH remains undisturbed, and the program is allowed to run its natural course for one hundred and twenty-eight more DUT cycles. These one hundred twenty-eight DUT cycles are the target sequence for which the waveforms are to be created. During the initial execution of the target sequence the next one hundred twenty-eight addresses for instructions words fetched from PGM SRAM 20 are logged into a 'Scope Mode FIFO 130 (to be described in connection with FIG. 4). At this point there is no restriction on what those one hundred twenty-eight instruction words may be, and they may include branching instructions.

At the conclusion of the execution of the target sequence the execution of the test program is halted, and a supervisory environment for the 'scope mode performs the activity shown in step 72 of the flowchart 64. That activity is to read the addresses stored in the 'Scope Mode FIFO 130 using the Ring Bus 85, use those addresses to extract from the PGM SRAM 20 the corresponding instruction words, set any branching fields in those instruction words to point to the next word in the target sequence (this is a must—we cannot have the target sequence continuing to do its own conditional branching, as that would make the waveforms non-stable), and then store them sequentially in a reserved portion of the PGM SRAM 20.

Subsequent executions of the test program will also satisfy the trigger condition, at which time the test program is temporarily halted, the values for VOH and the sample timing offset are changed from normal values to ones for use in the next step of the acquisition sweep, and the target sequence executed. Here are two ways that this can be implemented. First, a supervisory program for the 'scope mode can detect that PGM_QUIT has occurred during the 'scope mode and perform the VOH and sample timing offset changes (done by writing to a 'Scope Mode VOH Register 166 and 'Scope Mode Sample Timing Register 168, both discussed in connection with FIG. 5), followed by change via the Ring Bus to an internal program counter register (not shown) in a Next Address Calculator 102 (see FIG. 3) that moves the program counter to the address for the start of the reserved area. It is for this reason (among others) that the Next Address Calculator 102 is connected to the Ring Bus. The second way that this activity can be accomplished is similar, but to lift part of the burden from the supervisory 'scope mode program by having the Next Address Calculator include an additional internal register (not shown) for containing the starting address of the reserved area and that it can automatically jump to following a delay (suitable for the acquisition sweep values to be put into place) after an instance of TRIGGERED occurs.

The purpose of the acquisition sweep activity portion 66 of flowchart 64 is to repeatedly perform the executable target sequence stored in the reserved portion of the PGM SRAM 20. At step 73 the test program is restarted, from the beginning (so that any initialization important to the algorithms in the test program occurs). It is restarted with normal values for VOH and the sample timing offset, and the expectation is that the test program will execute exactly as it did previously, and will eventually satisfy the trigger specification in exactly the same manner as for the initial execution.

While the test program is executing, step 74 awaits, via looping path 75, the satisfaction of the trigger specification. When it is met step 76 halts the test program and sets the value for VOH to the first (next) value for the series of acquisition sweep steps that are to follow. (The terminology here is that many acquisition sweep steps make an acquisition sweep.) The same is done for the sample timing offset. Following that, step 77 allows the test program to continue (it is made to jump to the target sequence) and turns on a mechanism that will force receive vectors to be stored in ECR2 34b. Now we wait via the looping path 79 at step 78 until the target sequence is complete. Signal PGM_QUIT 157 of FIG. 4 assists with this. Its value is TRUE whenever the Micro-controller Sequencer 19 has stopped executing. This may be accomplished by having the one hundred twenty-ninth instruction word of the altered target sequence be a halt instruction.

When the execution of the target sequence is complete, step 80 moves the contents of ECR2 32b to memory available to the supervisory activity of the 'scope mode (preferably that's a program that run under the Operating System executing on the Test System Controller 2). At that time the 'scope mode software can begin the task of forming and displaying the partial results obtained thus far.

The next step 81 is to determine if we have reached the end of the acquisition sweep. If we have not, then path 82 loops back to step 73, so that the acquisition sweep can continue with another step. Flowchart 64 is simplified in this respect: We have not shown an inner loop within an outer loop that handles the notion that VOH is swept fastest, and through an entire suite of values for each different setting of the sample timing offset. That is, VOH changes fastest and repeats its sequence of changes, while the sample timing offset varies slowest, and experiences only one sequence of change. Nor does the flowchart specify the strategy for varying VOH: end-to-end linear trials, binary search, or a predictive search. Nor does the flowchart specify the strategy for ending variation of VOH for a given sample timing offset: do them all, or quit when there is confidence that the right answer has been discovered.

After the acquisition sweep has been concluded the "YES" path from step 81 transitions to the supervisory mechanism in the 'scope mode, whereupon the completed waveforms can be displayed, stored, printed, etc.

Figure 4:
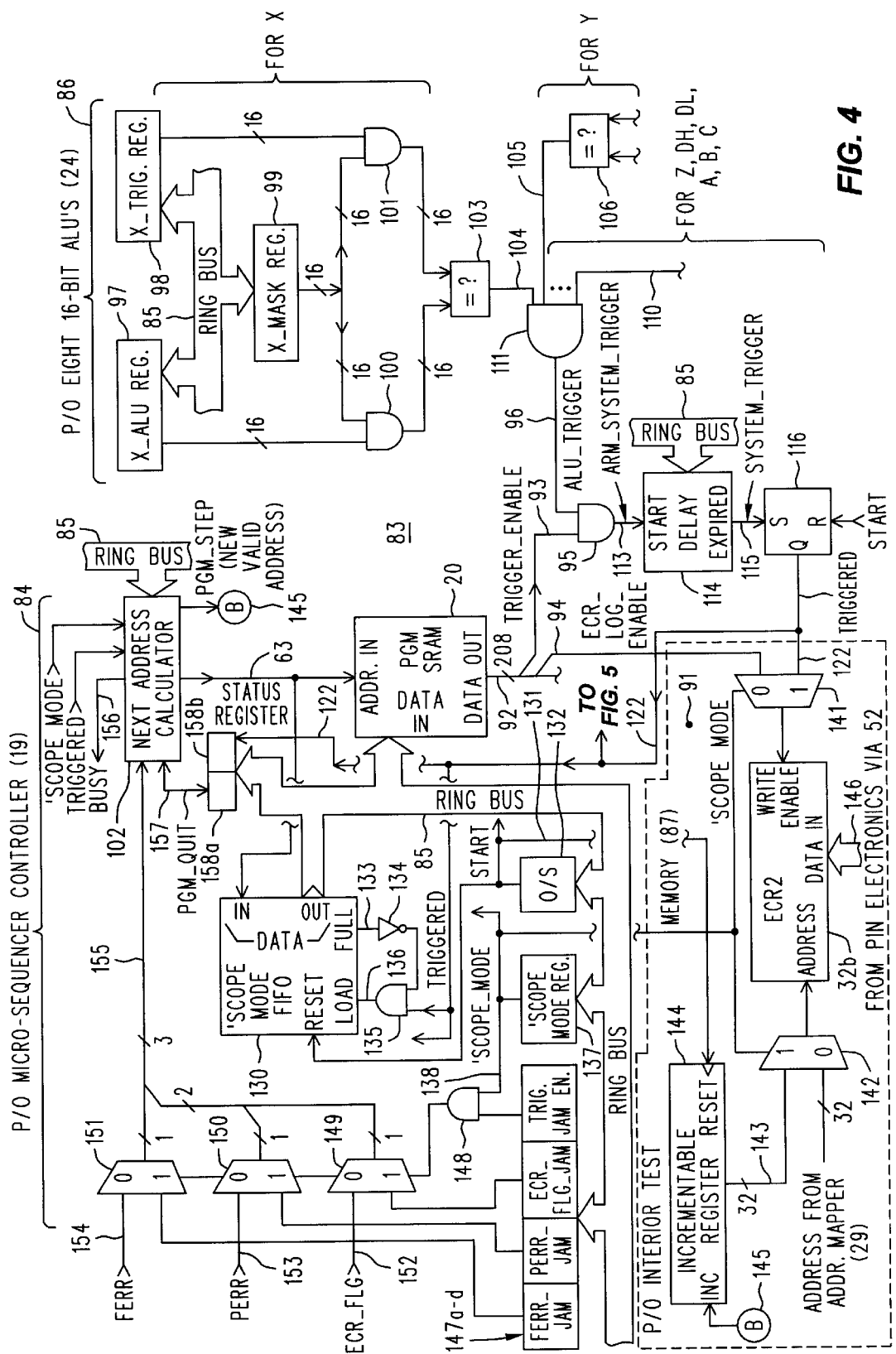
FIG. 4 is a more detailed block diagram of those portions of the block diagram of FIG. 2 that pertain to triggering and to the capture and execution of the target sequence.

Refer now to FIG. 4, which is a simplified block diagram of the hardware aspects of how the activity illustrated in FIG. 3 is implemented, and including the hardware needed for error flag jamming based on the satisfaction of a trigger specification. FIG. 4 is separable into three portions (84, 86, 91) that are related to items in the block diagram of FIG. 2. That is, portion 84 is an expansion of a part of the Micro-Sequencer Controller 19 of FIG. 2, portion 86 is an expansion of a part of the eight sixteen-bit ALU's 24 of FIG. 2, while portion 91 is an expansion of stuff that is found in the Interior Test Memory 87 that is shown in FIG. 2. Thus, FIG. 4 is an expansion of only a part of FIG. 2, with most of that Figure suppressed as not directly pertaining to the features presently of interest.

Let us begin with portion 86, whose task it is to generate a signal called ALU_TRIGGER 96. The portion 86 and ALU_TRIGGER represent the ALU component of the trigger specification. We show what is done for the X Register; what is done for the other seven registers (Y–C) is identical. We also show how what is done for these registers is combined to produce the signal ALU_TRIGGER 96. Thus, the place to begin is with an inspection of the X Register stuff.

Note that there is a sixteen-bit X_ALU Register 97 that communicates with the Ring Bus 85. This is indeed the X Address Register of FIG. 2, and whose bits contribute one third of the forty-eight address bits 27. In FIG. 4 we show the X_ALU Register 97 as being connected to just the Ring Bus 85 and to a by-sixteen two-input AND gate 100. It will, of course, be appreciated that the X_ALU Register 97 is connected to all kinds of other stuff for accomplishing arithmetic operations upon its content, but that for the sake of brevity all that has been omitted. It will further be appreciated that the output of AND gate 100 is sixteen bits (a simplification that aids the drawing considerably). The other sixteen bits that are applied to AND gate 100 come from a sixteen-bit X_Mask Register 99. The pattern of 1's in the X_Mask Register 99 selects which bits in the X_ALU Register 97 that are of interest in the trigger specification. There is also a sixteen-bit X_Trigger Register 98. It contains the X Register component of the trigger specification, and for that purpose is connected to the Ring Bus 85. It is also coupled to another by-sixteen two-input AND gate 101, whose other set of inputs are those of the X_MASK Register 99. It will readily be appreciated that the X Register component of the trigger specification is satisfied whenever the sixteen outputs of AND gate 100 equal (match, bit for bit) the sixteen outputs from AND gate 101. The determination of this circumstance is the purpose for the =?

circuit 103, which receives as inputs the two sixteen bits outputs of AND gates 100 and 101, and which produces an equality signal 104 as an output.

The Y Register circuitry of portion 86 is identical, although for brevity is not shown, save for the associated =? circuit 106 and its output 105. It will be appreciated that there are actually six more equality outputs (one for each remaining ALU Register), of which only one (110) is shown. The signal ALU_TRIGGER 96 is generated whenever all the ALU Register bits not masked out match their corresponding '_Trigger Registers. Accordingly, the collection of 104 ... 110 from the eight =? circuits is AND'ed together by AND gate 111 to produce ALU_TRIGGER 96.

Turning now to the Micro-Controller Sequencer portion 84, the signal ALU_TRIGGER 96 is only one component of producing a satisfied trigger specification. There remains a program component that must also be satisfied. The program component is represented by the signal TRIGGER_ENABLE 93. Assuming for the moment that TRIGGER_ENABLE 93 is present (we shall explain its origin next), it and ALU_TRIGGER 96 are combined by AND gate 95 to produce a signal ARM_SYSTEM_TRIGGER 113 that, when it is TRUE, stands for the condition that the basic trigger specification has been met, but that a delay might yet need to expire before the actual trigger is allowed to occur.

To proceed with this idea, note that the signal ARM_SYSTEM_TRIGGER 113 is applied to the start input of a Delay circuit 114, whose amount of delay is specified over its connection to the Ring Bus 85. The delay might be zero, or some other amount expressed as an absolute time interval or as a number of DUT cycles. Such circuits are believed to be conventional, and the specific details have been omitted. Delay circuit 114 could be any of various suitable types of delay mechanisms, including, but not limited to presetable counters, timers and voltage ramp/threshold arrangements. In any event, when the delay has expired following an onset of ARM_SYSTEM_TRIGGER 115, a signal SYSTEM_TRIGGER 115 is issued. It is coupled to the set input of a set/reset flip-flop 116. SYSTEM_TRIGGER 115 causes the Q output of the flip/flop 116 to go TRUE. That Q output is the signal TRIGGERED 122. It will persist until the end of the target sequence, and is used in various other places in FIG. 4. At the start of the next step in the acquisition sweep, the signal TRIGGERED 122 will go FALSE, owing to the occurrence of a signal START 131, which is issued from a one shot 132 coupled to the Ring Bus 85 and activated by software supervising the re-start of the test program as part of the next step in the acquisition sweep.

Now let's examine how the signal TRIGGER_ENABLE 93 originates. The short answer is that it is a bit in the two hundred and eight bit wide instruction word used by the Micro-Sequencer Controller 19. It (most likely) got set when the user specified to the supervisory mechanism for the 'scope mode that such and such a line in the source code is whose machine instructions(s) is/are to enable triggering, or (less likely) when the compiler encountered a suitable source code "enable trigger here" instruction explicitly put there by the programmer. In the first case the supervisory mechanism for the 'scope mode alters the machine instructions itself (which might or might not require compiler complexity), and in the second, the user altered the source code of the test program itself and re-compiled. There might be only one instruction word that has its TRIGGER_ENABLE bit set, or there may be consecutive string of them, or something in-between, where the bit comes and goes as the test program is executed.

To continue, the two hundred and eight bit instruction words are fetched from the PGM SRAM 20 that is addressed by an address 63 produced by a Next Address Calculator 102. The Next Address Calculator 102 does several additional things of interest. First, it produces a signal BUSY 156 whenever it is executing a program. This assists the various supervisory mechanisms in controlling the execution of patterns by the Micro-Sequencer Controller 19. The Next Address Calculator also produces a signal PGM_QUIT 157 that means that a condition has been encountered that halts program execution. One of those conditions is the AND of the signals TRIGGERED 122 and 'SCOPE MODE 138. The logic for implementing this is internal to the Next Address Calculator 102, and is not explicitly shown. The Next Address Calculator 102 also produces a signal PGM_STEP 145 (also indicated by the B in a circle) whose meaning at onset is that a new valid address is present at the output 63 of the Next Address Calculator 102. Onsets of PGM_STEP 145 may be used to inform other mechanisms that another step in the pattern (test program) is about to be executed.

While perusing this part of FIG. 4, note that the signals PGM_QUIT 157 and TRIGGERED 122 are coupled to associated bits (158a and 158b, respectively) of a Status Register readable by the Ring Bus. This also assists the various supervisory software mechanisms that oversee both normal and triggered operation.

Now note the presence of a 'Scope Mode FIFO 130 connected to the Ring Bus 85, such that its contents can be read (as data out) onto that bus. It also has a data input connected to the output of (address produced by) the Next Address Calculator 102. These connections support the acquisition of the addresses of the target sequence, and the subsequent retrieval thereof for alteration and storage into the reserved portion of the PGM SRAM 20 (which, note, is also connected to the Ring Bus 85). The 'Scope Mode FIFO has an internal addressing mechanism that automatically increments as signals are applied to a LOAD terminal. To get this internal address back to zero at the start of storing or reading a target sequence, a RESET terminal has the START signal 131 coupled to it. The LOAD terminal is driven by the output of an AND gate 135 whose inputs are TRIGGERED 122 and the inverted (by inverter 134) signal from a FULL terminal on the FIFO 130. This arrangement allows the continuous storing of the target sequence as it occurs, once TRIGGERED goes TRUE, up until the FIFO get full. Once that has happened, the supervisory software for the 'scope mode can read the content of the FIFO, fetch the corresponding instruction words from the PGM SRAM 20, alter them to adjust all branching to fall through to the next instruction, and then store the altered instructions into the reserved portion of the PGM SRAM 20.

Now note the single bit 'Scope Mode Register 137 connected to the Ring Bus 85. It is set by the supervisory software to indicate that a trigger specification is in effect. The output of the 'Scope Mode Register 137 is a signal 'SCOPE_MODE 138, which is used two places: by the error flag jamming mechanism and by the portion 91 that is an expansion of a part of the Interior Test Memory 87. We shall defer a discussion of error flag jamming until after we examine the last thing on FIG. 4 needed to support the 'scope mode of operation: portion 91.

The purpose of portion 91 is to store into ECR2 32b the receive vectors that belong to the target sequence. They will be cached there, one step in the acquisition sweep at a time, and be unloaded to the controlling 'scope mode software for construction of the waveforms. What is stored is the compare data 146 (it will come the Pin Electronics 9 via the Timing/Formatting & Comparison Circuit 52, as amplified in FIG. 5). Given that such compare data 146 is presented to the data input of ECR2, what we are interested in at the moment is how we get it stored. That has to be accomplished in a way that is respectful of the presence or absence of the normal mechanism for determining if errors are stored in an ECR, namely the signal ECR_LOG_ENABLE 94. It is a bit in the 208-bit instruction word that is set, or not, according to whether or not the programmer want to log error data for that portion of the test program. What we need to do, then, is force the Write Enable terminal for ECR2 32b to be TRUE whenever the target sequence is being executed. That is the purpose of MUX 141, which drives Write Enable of ECR2 with ECR_LOG_ENABLE if 'SCOPE_MODE is FALSE, (normal operation), or with TRIGGERED when 'SCOPE_MODE is TRUE. Another MUX 142 also uses 'SCOPE_MODE to change which address is applied to ECR2. In the normal mode of operation it is simply the usual address supplied by the Address Mapper 29. During 'scope mode it is a different address supplied by an Incrementable Register 144 whose value is reset to zero with the signal START 131, and that is incremented by the signal PGM_STEP 145. That is, it increments in synchrony with the execution of the target sequence. This arrangement stores the compare data (VOH threshold met or not) as the target sequence is executed. It is expected that the programmer will not use ECR2 for normal logging of error data for the test program.

Finally, note the four-bit register 147a–d connected to the Ring Bus 85. It contains four one-bit segments, three of which represent values to be jammed in place of the normal error flags. Thus, FERR_JAM 147a can replace FERR 154, PERR_JAM 147b can replace PERR 153, and ECR_FLG_JAM 147c can replace ECR_FLG 152. These replacements are performed when 'SCOPE_MODE 138 is TRUE (the 'Scope Mode Register 137 got set as a result of the trigger specification being met) and the fourth bit TRIGGER_JAM_ENABLE 147d is also set. AND gate 148 detects this condition, and its output is used to switch the MUX's 149, 150 and 151. Switching these MUX's is what does the jamming. The combined outputs 155 of the MUX's are applied to the Next Address Calculator 102, where they are used as qualifier inputs to affect branching in the test program.

Figure 5:
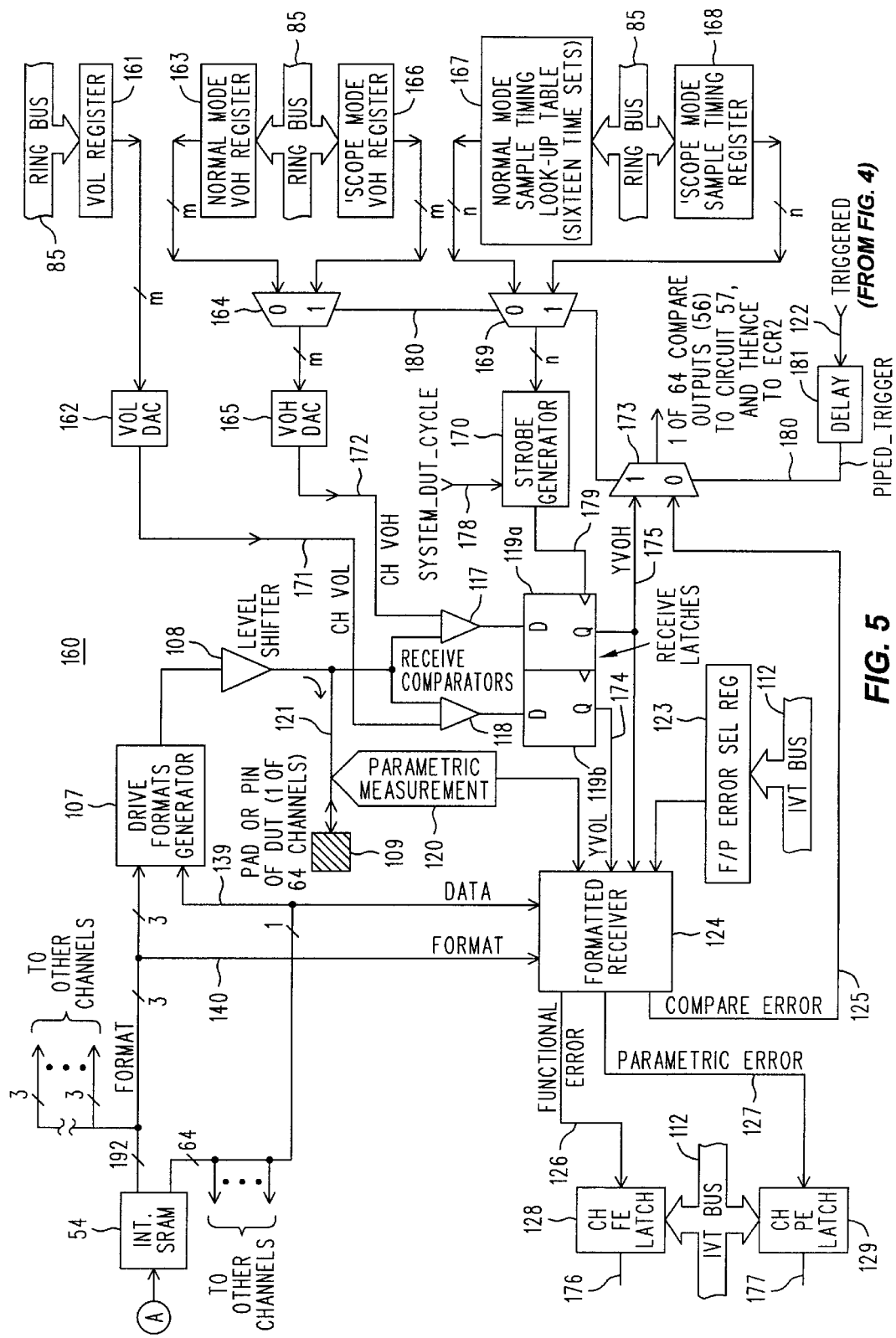
FIG. 5 is a more detailed block diagram of a portion of the block diagram of FIG. 2 that pertains to stepping the values of VOH and the sample timing offset during the performance of an acquisition sweep.

Now have a look at FIG. 5, wherein is depicted a simplified block diagram of the low-level circuitry (most of which exists on a per channel basis) that provides the actual compare data that will be stored in ECR2 32b during each step of the acquisition sweep. The left hand side of this figure is a subset of FIG. 5 in the incorporated MEMORY TESTER WITH ENHANCED PAST DECODE. Accordingly, we shall not dwell on that extensively; a brief summary shall suffice.

Note the pad or pin 109 of the DUT. It can be driven with a Level Shifter 108 activated by a Drive Formats Generator 107 that gets its FORMAT 140 and DATA 139 from an Internal SRAM 54 (also shown in FIG. 2 as part of circuit 52). Whether or not the pin 109 is being driven by the tester, we should (ordinarily) like to know if the voltage at the pin is within a specified range for whatever operation is being performed. To this end there are two comparators 117 and 118 that are coupled to the pin 109 and to CH VOH 171 (a per channel instance of VOH) and CH VOL 172 (a per channel instance of VOL), respectively. The signals CH VOH and CH VOL are the settable comparison voltages that the comparators compare against. The outputs of the comparators are latched into Receive Latches 119a and 119b, respectively, and whose outputs then produce the logical signals YVOH and YVOL, respectively. The latching is done at a time in the DUT cycle determined by a Strobe Generator 170 in accordance with an expressed sample timing offset, about all of which we shall have more to say in a bit.

YVOH and YVOL are applied to a Formatted Receiver 124 that evaluates the correctness of the measurement inputs in accordance with FORMAT signals 140, (expected) DATA 139 and information in an F/P Error Select Register 123 responsive to an IVT Bus. (It is an inter-chip extension of the VT Bus 89, since the piece of silicon we are on here—circuit 52—is different than the one the APG is on, and of which the Micro-Controller Sequencer 19 is a part.) In any event, the Formatted Receiver (of which there is one per channel) puts out a signal FUNCTIONAL ERROR 126, a signal PARAMETRIC ERROR 127, and a signal COMPARE ERROR 125. The signals FUNCTIONAL ERROR and PARAMETRIC ERROR are latched in respective latches 128 and 129, which in turn produce signals 176 and 177 that may be subjected to further processing, as a result of which are obtained the signals DFE 0:3 103 and DPE 0:3 104 that appear as inputs to circuit 52 in FIG. 2. What those things mean are outside the scope of the present disclosure; they are related to something called multi-DUT operation. What the reader should note is that the signal COMPARE ERROR 125 is what is usually stored as "actual" error data, perhaps in an ECR (Error Catch RAM), or that is perhaps first characterized as to kind (data classification or treatment in Post Decode) and then a suitable type indicator stored in an ECR. In any event, the reader should appreciate that in normal operation COMPARE ERROR 125 needs to be passed along as it is produced according to the FORMAT signals 140 applied to the Formatted Receiver 124. That information may not be the same as the "raw" (as it were) YVOH and YVOL. The reader should also further appreciate that during a step within an acquisition sweep it is exactly the "raw" YVOH (and only that) that needs to be dispatched to the rest of the system. To accomplish these different purposes is the function of (per channel) MUX 173. It receives both the per channel COMPARE ERROR 125 and the (per channel) YVOH 175 and sends on only the appropriate one, according to the signal PIPED_TRIGGER 180. That is, when PIPED_TRIGGER is FALSE the signal COMPARE ERROR 125 is selected, and the actual (uninterpreted) YVOH 175 is selected when PIPED_TRIGGER is TRUE.

A note is in order here about the signal PIPED_TRIGGER 180. It is the logical equivalent of TRIGGERED 122 (of FIG. 4), except that it is delayed by an amount equal to the delay induced by the pipeline that conveys signals from the Micro-Controller Sequencer 19, through the ALU's 24, the Address Mapper 29, the Interior Test Memory 87 and/or the Data MUX 35, the ADDR. Bit Select 37, Circuit 40, the Vector FIFO 45, and finally to the Timing/Formatting & Comparison Circuit 45 (which is where FIG. 5 is located). Because of this pipeline and its delay, the signal TRIGGERED 122 (which is at the head of the pipeline) occurs in time well before the transmit vector it is associated with is actually available for application to the DUT. There are three MUX's (164, 169 and 173) in FIG. 5 that are controlled by PIPED_TRIGGER 180. If we were to neglect the effects of pipeline delay, (say by using TRIGGERED in place of PIPED_TRIGGER) those MUX's would change too soon and invoke the 'scope mode of operation for DUT activity that actually (in a logical sense) precedes the occurrence of the trigger. That would goof things up considerably. Accordingly, the signal TRIGGERED 122 is delayed by a delay mechanism 181 to become PIPED_TRIGGER 180. Delay mechanism 181 can be either an actual separate circuit as shown, or it can be a dedicated path for TRIGGERED within the pipeline itself.

What remains now is to explain how the voltage thresholds VOL and VOH are produced, and how the sample timing offset is accomplished, the last two of which need to be toggled rapidly between normal programmatically determined values and the changing values needed for steps during an acquisition sweep.

Let's dispose of VOL first, since it has a simple and similar starting point, even though it itself is not part of the process of interest. VOL originates with a VOL Register 161 that is coupled to receive a digital value of m-many bits sent over the Ring Bus 85. Those m-many bits are applied to a VOL DAC 162 to produce the analog threshold voltage CH VOL 171 that is applied to comparator 118.

The production of CH VOH 172 is similar, except that its VOH DAC 165 is driven by the m-many bit output of a MUX 164 that selects between two m-bit registers settable by the Ring Bus 85. Those registers are a Normal Mode VOH Register 163 and a 'Scope Mode Register 166. The MUX 164 selects according to the value of the signal PIPED_TRIGGER 180, just as for MUX 173. That is, when PIPED_TRIGGER is TRUE it is the m-bit value of the 'Scope Mode Register 166 that is selected, otherwise it is the normal value from register 163. The value in the 'Scope Mode Register 166 can be set ahead of time by the supervisory 'scope mode software to a value in agreement with any desired strategy for varying VOH during a step in an acquisition sweep. The value of the CH VOH voltage 172 can thus be changed very quickly from its normal value, once the signal PIPED_TRIGGER 180 is exerted, and equally quickly returned to normal when PIPED_TRIGGER goes away.

Finally, we need to deal with the issue of similarly switching between normal values for the sample timing offset and those needed for the acquisition sweep. It will be done in a generally similar manner, in that there is a MUX 169 controlled by PIPED_TRIGGER 180 that selects between the output of a 'Scope Mode Sample Timing Register 168 connected to the Ring Bus 85 and a normal mode 'something' (167, described below). The two things being selected between are each n-many bits in size, and describe a delay for the strobing of the Receive Latches 119a–b that is relative to some reference signal, which we shall call SYSTEM_DUT_CYCLE 178, and which is applied to a Strobe Generator 170. The delay value selected by the MUX 169 (that of register 186 for 'scope mode, else that from 'something' 167') is also applied to Strobe Generator 170. The Strobe Generator (which is essentially a digitally controlled delay generator) issues a delayed output 179 that is applied to the Receive Latches 119a–b. That output may, for our present purposes, be considered as the onset of SYSTEM_DUT_CYCLE 178 as delayed by the amount of the n-many bit value from the MUX 169. That n-bit value may, for example, describe that delay in amounts that are multiples of, say, 19.5 pico seconds.

Now what about the mysterious 'something' 167? Well, to begin with it could, in the simplest embodiment, be a mere n-bit register coupled to the Ring Bus 85, just as the 'Scope Mode Sample Timing Register 168. Then we would call it a Normal Mode Sample Timing Register. The trouble with this is not that it does not work (it does), but rather that it affords the test program only one sample timing offset resource, and that the programmer has to do a lot of extra work every time the sample timing offset is to change, Phooey. It is instead preferred that there be selectable 'Time Sets' that are programmable in advance and easily selected between as the test program is executing. These Time Sets live in a Normal Mode Sample Timing Look-Up Table 167, and there are, say, sixteen of them. And they may hold more stuff than just sample timing offset information. For the sake of brevity those issues can be omitted, as they are not relevant to our present purpose. Accordingly, it sufficient to describe the Normal Mode Sample Timing Look-Up Table 167 as an addressable sixteen element storage mechanism, each addressable location of which can store some number fields, one of which is an n-bit value, and which once addressed, provides, among other things at its output, the n-bit value currently stored in the most recently addressed location. As described, the notion of a Time Set is believed to be conventional, and the needed Normal Mode Sample Timing Look-Up Table 167 can be fashioned from standard IC library components in a known manner.

We claim:

1. A method of producing a representation of voltage waveforms for selected channels of a Device Under Test (DUT) operated by a tester that executes a test program having an algorithmic nature that includes branching based on responses of the DUT to stimuli provided by the test program, the method comprising the steps of:

(a) generating a trigger signal indicative of the simultaneous occurrence of selected conditions within the hardware of the tester, including the execution of a selected portion of the test program;

(b) subsequent to an initial generation of the trigger signal by step (a), capturing a target sequence of addresses that correspond to a target sequence of instructions that is a selected number of consecutive instructions executed by the test program following the occurrence of the trigger signal;

(c) subsequent to step (b), fetching the target sequence of instructions identified by the captured target sequence of addresses;

(d) subsequent to step (c), altering the fetched target sequence of instructions to adjust any branching therein to point to the next instruction in the sequence thereof;

(e) subsequent to step (d), storing the altered target sequence of instructions in a reserved portion of a program memory from which the test program is executed; and then (f) repeatedly, and in the order specified below, until step (f6) has stored a sufficient amount of comparison results to allow the production of the representation of the voltage waveforms for the selected channels:

(f1) re-starting the test program;

(f2) generating a subsequent instance of the trigger signal;

(f3) interrupting the execution of the test program;

(f4) putting into effect for the selected channels selected values of a voltage comparison threshold and a sample timing offset;

(f5) resuming the execution of the test program at the start of the stored altered target sequence of instructions;

(f6) storing comparison results for the selected channels; and then:

(g) producing from the stored comparison results a representation of the voltage waveforms for the selected channels.

2. A method as in claim 1 wherein steps (a) and (f2) delay the onset of the trigger signal by a selected amount.

3. A method as in claim 1 wherein the tester is a memory tester and the DUT is a memory.

4. A method of generating a trigger signal in a tester that executes a test program having an algorithmic nature that manipulates the contents of a plurality of ALU hardware registers within the tester and whose contents represent associated signal traffic between the tester and a Device Under Test (DUT), the method comprising the steps of:

(a) for each ALU hardware register in the plurality thereof, selecting any combination of bit positions, including none, that are to contribute to generating the trigger signal;

(b) associating a separate trigger value register with each ALU hardware register;

(c) for each trigger value associated with an ALU hardware register that had at least one bit position selected in step (a), loading into those same bit positions that were selected the bit for bit value that the associated ALU hardware register is to have for the trigger signal to be generated;

(d) for each trigger value register, selecting the same combination of bit positions that was selected in step (a) for the corresponding ALU hardware register;

(e) for each pair of ALU hardware and associated trigger value registers, bit-wise comparing for equality the selected combination of ALU hardware bits with the selected combination of bits in the associated trigger value register;

(f) generating a trigger signal upon a determination that step (e) indicated equality;

(g) defining selected alternate values for error flags that affect branching within the test program; and (h) subsequent to the generation of the trigger signal in step (f), replacing the actual values of the error flags with their corresponding alternate values.

5. A method as in claim 4 wherein:

(i) step (a) further comprises the step of associating a different mask register with each ALU hardware register, the step of loading a value into each mask register, those values being one's in those bit positions that are to be selected in the corresponding ALU hardware register, and the step of performing bit-wise AND'ing's between each ALU hardware register and its associated mask register, the results of the bit-wise AND'ing's representing the content of the selected combinations of bit positions for their respective ALU hardware registers; and (ii) step (c) further comprises the step of associating a different mask register with each trigger value register, the step of loading a value into a separate mask register, those values being one's in those bit positions that are to be selected in the corresponding trigger value register, and the step of performing bit-wise AND'ing's between each trigger value register and its associated mask register, the results of the bit-wise AND'ing's representing the content of the selected combinations of bit positions for their respective trigger value registers.

6. A method as in claim 4 further comprising the step of including in executable instruction words of the test program a trigger enable bit in those executable instruction words that correspond to portions of the test program intended to allow the generation of the trigger signal, and wherein step (f) further includes the condition that the trigger enable bit be present to allow generating the trigger signal.

7. A method as in claim 4 further comprising the steps of:

(i) subsequent to the generation of the trigger signal in step (f), capturing a target sequence being a selected number of consecutive instruction words executed by the test program;

(j) subsequent to step (i), repeatedly re-starting the test program and upon the occurrence of the trigger signal branching to continue execution with the captured target sequence;

(k) during repeated executions of the captured target sequence caused by step (j), varying a voltage threshold for selected channels of the DUT and varying sample timing offset;

(l) storing threshold comparison data resulting from step (k); and (m) generating from the threshold comparison data stored in step (l) a representation of the voltage waveforms for the selected channels and representing the period of time corresponding to the execution of the captured target sequence subsequent to the trigger signal.

8. A method as in claim 4 further comprising the step of delaying the onset of the generated trigger signal by a selected amount.

9. A method as in claim 4 wherein the tester is a memory tester and the DUT is a memory.

10. A method of generating a trigger signal in a tester that executes a test program having an algorithmic nature that manipulates the contents of a plurality of ALU hardware registers within the tester and whose contents represent associated signal traffic between the tester and a Device Under Test (DUT), the method comprising the steps of:

(a) for each ALU hardware register in the plurality thereof, selecting any combination of bit positions, including none, that are to contribute to generating the trigger signal;

(b) associating a separate trigger value register with each ALU hardware register;

(c) for each trigger value register associated with an ALU hardware register that had at least one bit position selected in step (a), loading into those same bit positions that were selected the bit for bit value that the associated ALU hardware register is to have for the trigger signal to be generated;

(d) for each trigger value register, selecting the same combination of bit positions that was selected in step (a) for the corresponding ALU hardware register;

(e) for each pair of ALU hardware and associated trigger value registers, bit-wise comparing for equality the selected combination of ALU hardware bits with the selected combination of bits in the associated trigger value register;

(f) generating a trigger signal upon a determination that step (e) indicated equality;

(g) subsequent to the generation of the trigger signal in step (f), capturing a target sequence being a selected number of consecutive instruction words executed by the test program;

(h) subsequent to step (g), repeatedly re-starting the test program and upon the occurrence of the trigger signal branching to continue execution with the captured target sequence;

(i) during repeated executions of the captured target sequence caused by step (h), varying a voltage threshold for selected channels of the DUT and varying sample timing offset;

(j) storing threshold comparison data resulting from step (i); and (k) generating from the threshold comparison data stored in step (j) a representation of the voltage waveforms for the selected channels and representing the period of time corresponding to the execution of the captured target sequence subsequent to the trigger signal.

* * * * *